United States Patent [19]
Matsumoto

[11] Patent Number: 5,837,601
[45] Date of Patent: Nov. 17, 1998

[54] CMOS SEMICONDUCTOR DEVICE HAVING DUAL-GATE ELECTRODE CONSTRUCTION AND METHOD OF PRODUCTION OF THE SAME

[75] Inventor: Koichi Matsumoto, Kanagawa, Japan

[73] Assignee: Sony Corporation, Tokyo, Japan

[21] Appl. No.: 788,191

[22] Filed: Jan. 24, 1997

[30] Foreign Application Priority Data

Jan. 25, 1996 [JP] Japan .................................. 8-010835

[51] Int. Cl.$^6$ .................... H01L 21/3205; H01L 21/4763
[52] U.S. Cl. .......................................... 438/592; 438/655
[58] Field of Search ................................... 438/586, 592, 438/655

[56] References Cited

U.S. PATENT DOCUMENTS

| | | | |
|---|---|---|---|
| 4,786,611 | 11/1988 | Pfiester | 438/592 |
| 5,341,014 | 8/1994 | Fujii et al. | 438/655 |
| 5,355,010 | 10/1994 | Fujii et al. | 438/592 |
| 5,633,523 | 5/1997 | Kato | 257/369 |

Primary Examiner—Brian Dutton
Attorney, Agent, or Firm—Hill & Simpson

[57] ABSTRACT

A semiconductor device in which mutual diffusion of doped impurities occurring through an upper silicide electrode layer is prevented. A silicide electrode layer is doped with both the same degree of p-type impurities as the concentration of p-type impurities of the lower gate electrode layer and the same degree of n-type impurities as the concentration of n-type impurities. As a result, the concentration of doped impurities of the gate electrode layer is balanced at the two sides of the interface of the pMOS side and nMOS side. Therefore, heat diffusion caused by subsequent heat treatment is prevented and the problem of mutual diffusion can be solved. The present invention is also suitable for the SALICIDE process. Even when the silicide electrode layer is formed simultaneously on an extremely shallow source or drain regions since the concentration of the impurities of the silicide electrode layer was initially high, the lower impurities will not be drained so the contact resistance will not be made to deteriorate. As a result, it becomes easy for the SALICIDE process to be applied to submicron devices. In the method of production of the present invention, the silicide electrode layer is formed by the CVD method or the sputtering method and the impurities doped during this process, so no special step has to be provided for introducing the impurities.

4 Claims, 3 Drawing Sheets

CMOS SEMICONDUCTOR DEVICE HAVING DUAL-GATE ELECTRODE CONSTRUCTION AND METHOD OF PRODUCTION OF THE SAME

BACKGROUND OF THE INVENTION

1. Field of the Invention

The present invention relates to a semiconductor device and a method of production of the same, more particularly the present invention relates to a so-called dual gate construction complementary metal oxide (CMOS) semiconductor device which has both a p-type conductivity and n-type conductivity and prevents mutual diffusion of impurities doped into the gate electrodes and to a method of production of the same.

2. Description of the Related Art

At the present time, many CMOS large-scale integrated circuits (LSI) adopt a "polycide" gate electrode structure comprised of a high melting point metal silicide layer and a polycrystalline silicon layer so as to reduce the resistance of the gate electrodes. The above-mentioned polycrystalline silicon layer normally is the same in conductivity at the pMOS side and the nMOS side. As such a polycrystalline silicon layer, use is made for example of an n-type polycrystalline silicon layer doped with phosphorus etc. to a high concentration.

The difference in the work function between n-type polycrystalline silicon and the silicon substrate side however differs depending on whether the conductivity of the substrate side is the n-type or the p-type. Further, the difference in the absolute values of the threshold values (Vth) of the pMOS side and nMOS side is also large. Therefore, before forming the gate electrodes, boron or other p-type conductivity impurity ions are injected into the surface of the semiconductor substrate forming the channel region so as to preadjust it so that the absolute values of the threshold values of the nMOS and pMOS sides become substantially the same.

Accordingly, a MOS transistor fabricated by this method is a surface channel type at the nMOS side and is a buried channel type with a shallow pn junction and a channel somewhat to the inside of the substrate from the surface at the pMOS side.

The higher degrees of integration achieved in recent years, however, has led to shorter lengths of gate electrodes even in CMOS LSIs. Along with this, suppression of the short channel effect has become a major problem.

In such current day CMOS LSIs, it has long been pointed out that buried channel type pMOSs are particularly susceptible to the short channel effect. This has become a major problem along with the advances made in shortening gate lengths. To overcome this problem, it is desirable to make both the pMOS and nMOS sides the surface channel type. Therefore, dual-gate electrode constructions giving the same conductivity for the channels and gate electrodes have come into use.

In such a surface channel type dual-gate electrode construction, a p-type or an n-type impurity is selectively doped into the lower layer of polycrystalline silicon separately for the pMOS side and nMOS side. These different conductivity impurity regions are connected with each other through a tungsten silicide ($WSi_x$) or other silicide electrode layer provided at the top for reducing the resistance.

In the above-mentioned surface channel type dual-gate electrode construction, however, the later heat treatment such as the annealing for activating the source and drain regions causes the doped impurities with the different conductivities to diffuse in the lateral direction toward the opposite conductivity gates primarily through the upper suicide electrode layer. If this mutual diffusion occurs, this changes the work functions of the gate electrodes and causes a shift In the threshold voltages (Vth) which had been adjusted so give substantially the same absolute values. The so-called depletion of the gates causes an Increase in the value of the static capacitance and obstructs the high speed operation of the LSI.

Various proposals have been made to deal with this.

For example, IEEE 1994 Symposium on VLSI, Digest of Technical Papers, pp. 117–118, describes a method of changing the composition of the silicide electrode layer ($WSi_x$ layer) on the gate electrodes to make the silicon concentration higher.

Further, Fujii et al., Spring 1994 41st Seminar on Applied Physics, Preprints of Papers, No. 2, p. 675, "Effect of Suppression of Lateral Diffusion of As by PolySi/WSix/PolySi Construction", described a method of forming a further polycrystalline silicon layer on the WSix layer to form a PolySi/WSix/PolySi construction.

These methods, however, merely improve the construction or characteristics to make it difficult for the impurities to diffuse in the $WSi_x$ layer, that is, the path of diffusion of the impurities. They cannot really be said to fundamentally overcome the disadvantage of the occurrence of mutual diffusion. Accordingly, if higher degrees of integration are achieved and annealing conditions become further severer, there is a chance that this disadvantage will arise again.

Further, in the former method of changing the composition of the $WSi_x$ layer, the sheet resistance rises in value along with the increase of the ratio of the silicon. This is not desirable for a semiconductor device.

SUMMARY OF THE INVENTION

An object of the present invention is to provide a CMOS semiconductor device having a dual-gate construction which prevents the occurrence of mutual diffusion of doped impurities through the upper silicide electrode layer and a method for the production of the same.

The present inventors gave extensive thought to the mutual diffusion of doped impurities so as to solve the above problems in the related art and as a result concluded that this mutual diffusion occurred due to the existence of a gradient in concentration between the polycrystalline silicon or other gate electrode layer and the silicide gate electrode layer. That is, they discovered that the crux of the disadvantage lay in the fact that at the time of annealing to activate the source or drain regions etc., impurities are drawn from the gate electrode layer side where the impurities are doped to a high concentration to the silicide electrode layer side where impurities are either not doped or else even when doped are doped to a low concentration and therefore the concentration of impurities at the gate electrode layer is reduced.

The present invention prevents this drainage of the impurities by balancing the concentration of the doped impurities between the gate electrode layer and the silicide electrode layer in advance. That is, the present invention provides a CMOS semiconductor device having a dual-gate electrode construction in which the suicide electrode layer is doped with both the same degree of p-type impurities as the concentration of p-type impurities of the lower gate electrode layer and the same degree of n-type impurities as the concentration of n-type impurities of the gate electrode layer.

As a result, since the doped impurities at the gate electrode layer are kept at high, constant concentrations at the two sides of the interface of the gate electrode layer and the silicide electrode layer at both the pMOS side and the nMOS side, even if heat treatment etc. is applied after the formation of the silicide electrode layer, the doped impurities at the gate electrode layer will not diffuse to the silicide electrode layer side through this interface. Accordingly, there will be no change in the difference of the work functions of the gate electrode layer and substrate side and no shift in the threshold voltages. Further, there will be no increase in the capacitance of the gate electrodes. As a result, it becomes possible to fundamentally solve the above-mentioned problem of mutual diffusion.

In particular, a silicide electrode layer with such a higher concentration of impurities is suitable for the "self-aligned silicide" (SALICIDE) process. In the SALICIDE process, the increase in the resistance of the gate electrodes and source and drain regions accompanying the miniaturization of transistors is eased by forming a silicide electrode layer all at once by self-alignment over the gate electrode and the source and drain impurity diffusion regions. If a silicide electrode layer is formed over an extremely shallow impurity diffusion region in such a miniaturized transistor, however, the silicide electrode layer will drain the impurities from the substrate side in the annealing step for forming the suicide and, as a result, the problem will arise of a higher contact resistance (for example, see Extended Abstracts of the 1993 International Conference on Solid State Devices and Materials, pp. 564–566). According to the present invention, however, the concentration of the impurities at the suicide electrode layer is raised in advance, so it is possible to effectively prevent the drainage of the impurities by this heat diffusion.

According to a first aspect of the present invention, there is provided a CMOS semiconductor device having a dual-gate electrode construction comprised of a p-channel MOS transistor having a p-type gate electrode and an n-channel MOS transistor having an n-type gate electrode formed adjacent to the p-channel MOS transistor, the p-type gate electrode and the n-type gate electrode each having a dual-gate electrode construction comprised of a lower gate electrode layer with p-type or n-type impurities doped separately for the different channel conductivity type transistor regions and an upper common silicide electrode layer, and the upper silicide electrode layer being doped with both the same degree of p-type impurities as the concentration of p-type impurities of the lower gate electrode layer and the same degree of n-type impurities as the concentration of n-type impurities of the lower gate electrode layer.

Preferably, the silicide electrode layer is formed not only over the gate electrode layer, but also over the source and drain impurity diffusion regions formed on the surface of the semiconductor substrate near to the gate electrode layer.

More preferably, the silicide electrode layer is comprised of a material selected from the group comprised of tungsten suicide, titanium silicide, cobalt silicide, and nickel silicide.

More preferably, the dual-gate electrode construction comprised of the lower gate electrode layer with p-type or n-type impurities doped separately for the different channel conductivity type transistor regions and an upper common silicide layer is formed by self-alignment.

According to another aspect of the present invention, there is provided a method for the production of a CMOS semiconductor device having a dual-gate construction comprised of, at the time of forming dual-layer construction gate electrodes comprised of a lower gate electrode layer with p-type or n-type impurities doped separately for the different channel conductivity type transistor regions of the p-channel and n-channel MOS transistors and an upper common silicide electrode layer, forming a polycrystalline silicon film for forming the lower electrode layer, selectively doping that polycrystalline silicon film with p-type or n-type impurities for the different channel conductivity type transistor regions, and forming a silicide film to form the upper electrode layer on the polycrystalline silicon film, the silicide film being doped with both the same degree of p-type impurities as the concentration of p-type impurities of the lower gate electrode layer and the same degree of n-type impurities as the concentration of n-type impurities of the gate electrode layer while being formed.

Preferably, the dual-gate electrode construction comprised of the lower gate electrode layer with p-type or n-type impurities doped separately for the different channel conductivity type transistor regions and an upper common suicide layer is formed by self-alignment.

More preferably, the silicide electrode layer is formed by the CVD method or the sputtering method.

More preferably, the silicide electrode layer is comprised of a material selected from the group comprised of tungsten silicide, titanium silicide, cobalt silicide, and nickel silicide.

In the method of production of a CMOS semiconductor device of the present invention, since the silicide electrode layer is formed by the CVD method or sputtering method and the impurities doped into the same, there is no increase in the number of steps of production for doping the impurities.

BRIEF DESCRIPTION OF THE DRAWINGS

These and other objects and features of the present invention will become more apparent from the following description of the preferred embodiments made with reference to the attached drawings, in which:

FIGS. 2B and 2C are profiles of the concentration of impurities from the surface of the gate electrode of FIG. 2A in the direction of depth, wherein FIG. 2B shows the nMOS side and FIG. 2C shows the pMOS side.

DESCRIPTION OF THE PREFERRED EMBODIMENTS

Embodiments of the CMOS semiconductor device having a dual-gate electrode construction according to the present invention and a method for the production of the same will be explained below with reference to the drawings.

First Embodiment

Figure 1:
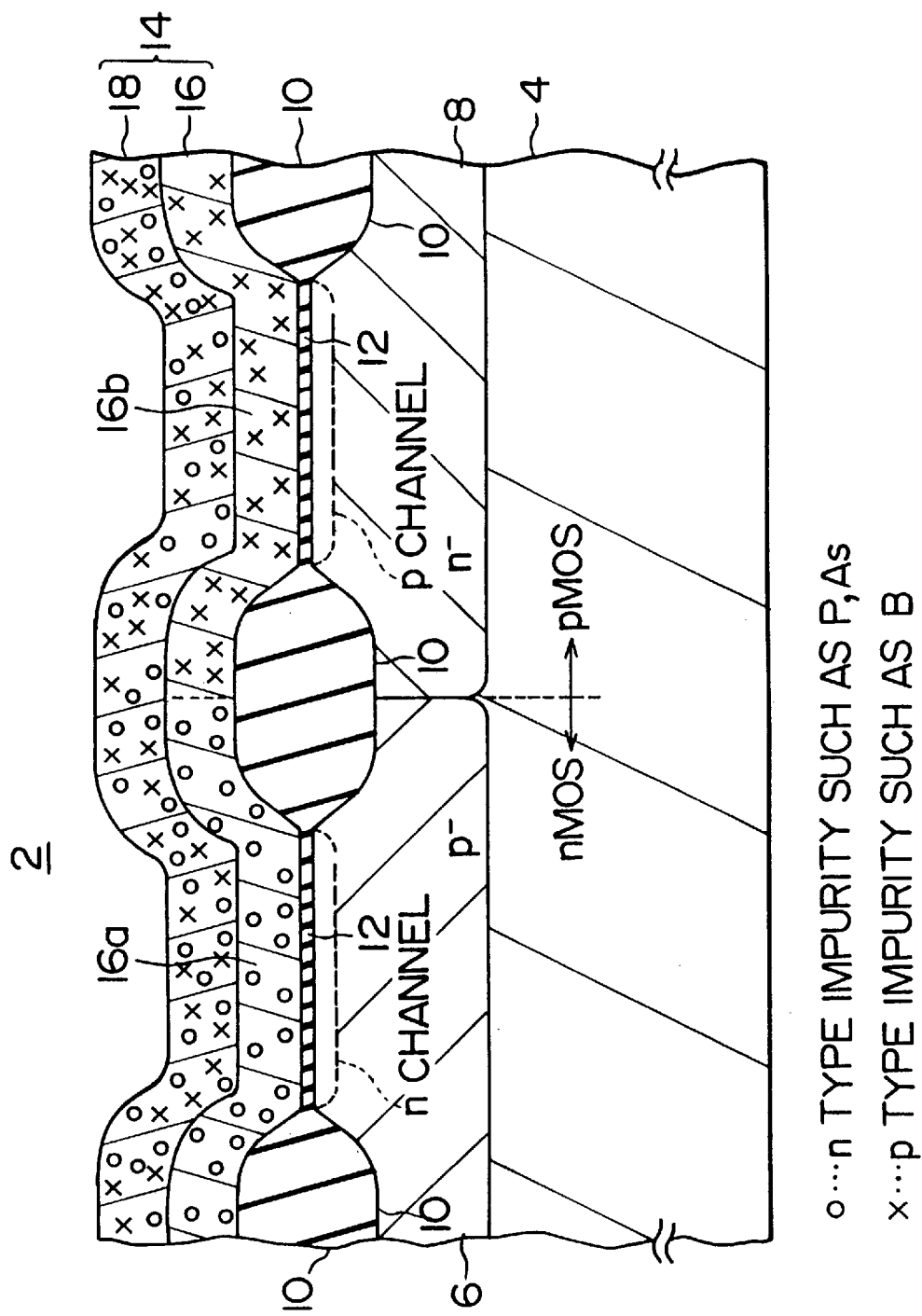
FIG. 1 is a schematic sectional view of the construction of a CMOS semiconductor device according to a first embodiment of the present invention seen from the direction of the gate interconnections.

FIG. 1 is a schematic sectional view of the construction of a CMOS semiconductor device according to a first embodiment of the present invention showing the portion where the different channel conductivity type transistor regions, that is, the p-type and n-type transistor regions, adjoin each other, from the direction of the gate interconnections.

The CMOS semiconductor device 2 is formed with wells acting as functional regions of the n-channel MOS transistors (hereinafter referred to as "nMOS") and the p-channel MOS transistors (hereinafter referred to as "pMOS"). More specifically, in the illustrated embodiment, the surface of the silicon wafer or other semiconductor substrate 4 is formed with the p-well 6 and n-well 8 with different conductivities from each other as so-called "twin tub" functional regions by for example ion implantation. Note that the constructions of the wells are not limited to the ones illustrated. Either of the p-well or the n-well may also be formed on the surface of the substrate with an opposite conductivity.

At the surface of the substrate 4 at the interface of the two transistor regions is formed a LOCOS (local oxidation of silicon) region comprised of an oxide film thicker than the gate oxide film 12. This achieves separation of the transistor regions along the lateral direction.

At the surface of the transistor regions not covered by the LOCOS region 10 is formed a thin gate oxide film 12 by for example the wet oxidation or other thermal oxidation method. The gate oxide film 12 is for example about 10 nm thick. At the surface of the substrate 4 directly under the gate oxide film 12 at the nMOS side and the pMOS side are formed n-type and p-type inversion layers (n-channel and p-channel) as shown by the dotted lines when applying a predetermined bias at the time of operating the CMOS semiconductor device 2.

On the gate oxide film 12 are formed a lower gate electrode layer 16 comprised of a polycrystalline silicon film etc. and an upper silicide electrode layer 18 formed on top of the same. These two-layer construction gate electrodes are referred to collectively as the dual-layer construction gate electrode 14. The gate electrode layer 16 is normally made of polycrystalline silicon and is made conductive for use as an electrode. The gate electrode layer 16 is for example about 200 nm thick.

In this CMOS semiconductor device 2, both of the pMOS and nMOS transistors are made surface channel types effective for preventing the short channel effects. Therefore, it is not necessary to make the dual-layer construction gate electrode 14 the same conductivity as the channel. In this embodiment, the gate electrode layer 16 is doped with n-type or p-type impurities at the transistor regions divided at the center of width of the LOCOS region 10. In other words, the gate electrode layer 16 is comprised of an n-type gate electrode portion 16a at the nMOS side where phosphorus (P), arsenic (As), or other n-type impurities are doped and a p-type gate electrode portion 16b at the pMOS side where boron (B) or other p-type impurities are doped. The selective doping of the impurities will be explained later.

The silicide electrode layer 18 is obtained by silicification of a high melting point metal and is comprised for example of tungsten silicide ($WSi_x$), titanium silicide ($TiSi_2$), cobalt silicide ($CoSi_2$), nickel silicide (NiSi), etc. This silicide electrode layer 18 is formed by for example the CVD method or sputtering method. In the present invention, this silicide electrode layer 18 is doped with the same degree of n-type impurities as the concentration of n-type impurities of the n-type gate electrode portion 16a of the lower gate electrode layer 16 and the same degree of p-type impurities as the concentration of p-type impurities of the p-type gate electrode portion 16b. The method of doping these impurities will be explained later.

While not illustrated, the dual-layer construction gate electrode 14 is patterned into a predetermined shape required for use as an electrode. Further, a predetermined source or drain region is formed at the surface of the semiconductor substrate 4 at the two sides of the gate electrode 14 in the width direction thereof in the direction perpendicular to the plane of the drawing adjoining the n-channel or p-channel. Further, a predetermined metal interconnection layer is formed via an interlayer insulating layer over the dual-layer construction gate electrode 14 and source or drain region (not shown). Connection with the electrode is possible through predetermined contact holes from outside of the layers formed on the dual-layer construction gate electrode 14.

Next, the method of production of the CMOS semiconductor device 2 of this configuration will be explained.

First, a silicon wafer or other semiconductor substrate 4 is prepared and the wells 6 and 8 are formed on the same. Specifically, the nMOS transistor region at the left half of the figure is for example doped with a p-type impurity to a relatively low concentration to form the p-well 6 using a silicon oxide film for example as a mask. Similarly, the pMOS transistor region at the right half of the figure is doped with an n-type impurity to a relatively low concentration to form the n-well 8.

Next, a LOCOS region 10 is formed on the above formed semiconductor substrate by a usual method, then wet oxidation etc. is performed to form the gate oxide film 12. The LOCOS region 10 is formed by for example first successively forming a pad use thermal oxide film and an anti-oxidation film comprised of a silicon nitride film etc., patterning the anti-oxidation film in a predetermined manner, then injecting ions for the channel stopper and performing the thermal oxidation for the LOCOS region.

Next, for example, the CVD method is used to form a gate electrode layer 16 of a polycrystalline film etc., then this is selectively doped with impurities to divide it into the n-type gate electrode portion 16a and the p-type gate electrode portion 16b. This selective doping of impurities can for example be achieved by twice alternately forming a master pattern of a resist etc. formed by usual photolithography and implanting the ions. The conditions for the ion implantation are not particular limited. For example, to make the nMOS side conductive, arsenic ions ($As^+$) are doped with a dosage of $1 \times 10^{15}/cm^2$ and an energy of 20 KeV. The conditions for the pMOS side are for example doping of borofluoride ions ($BF_2^+$) with a dosage of $1 \times 10^{15}/cm^2$ and an energy of 20 KeV.

Next, the silicide electrode layer 18 is formed by the CVD method or the sputtering method. When forming the layer, impurities of the same concentrations as the n-type electrode portion 16a and the p-type electrode portions 16b are doped. For example, in the case of use of the CVD method, it is possible to form a silicide film including an impurity by passing an impurity gas (for example phosphine ($PH_3$), diborane ($B_2H_6$), argine ($AsH_3$), etc.) at the same time as the metal halide (for example, tungsten hexafluoride ($WF_6$), titanium tetrachloride ($TiCl_4$), etc.) and silane family gas (for example, silane ($SiH_4$), dichlorosilane ($SiH_2Cl_2$), etc.) The concentration of the doped impurities is adjusted by changing the rate of flow of the impurity gas to those of the metal halide and silane family gas. In the sputtering method, use is made of a target containing a predetermined weight percent of the impurity to obtain a silicide film containing the impurity.

The subsequent processing of the dual-layer construction gate electrode 14, formation of the source and drain regions, formation of the interlayer insulating layer and the contact holes, formation of the metal interconnection layer, etc. are performed by the usual methods.

Figure 2A:
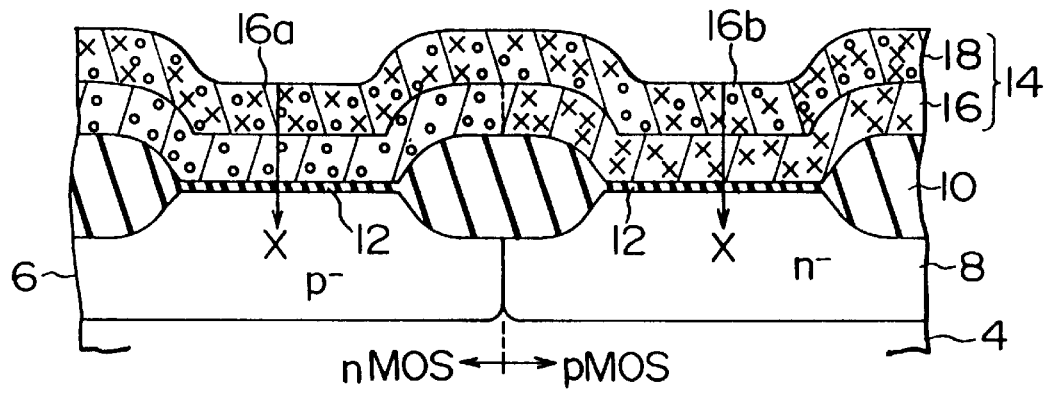
FIG. 2A is a schematic sectional view of the construction of the CMOS semiconductor device illustrated in FIG. 1 seen from the direction of the gate interconnections.

FIG. 2A shows the semiconductor device illustrated in FIG. 1. The illustration in FIG. 2A shows the same things as explained with reference to FIG. 1.

Figure 2B:
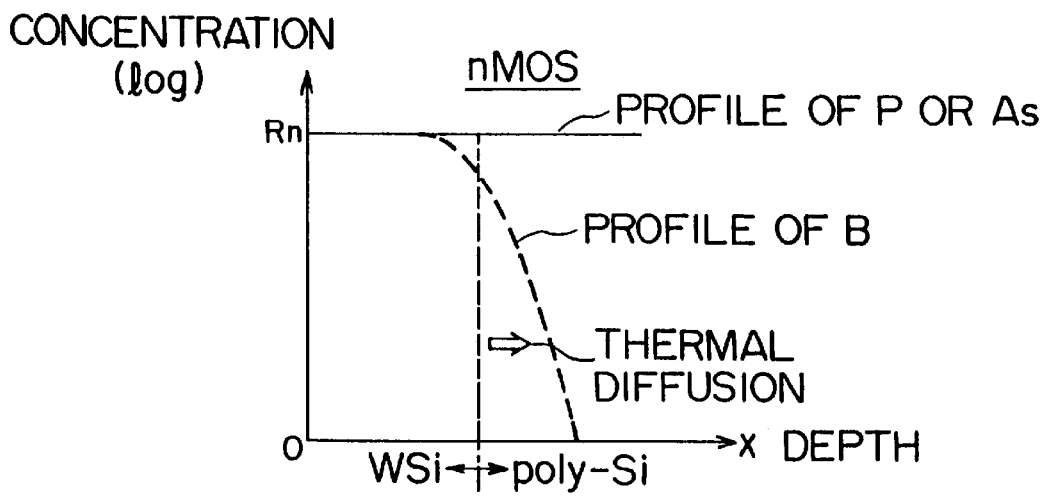
Figure 2C:
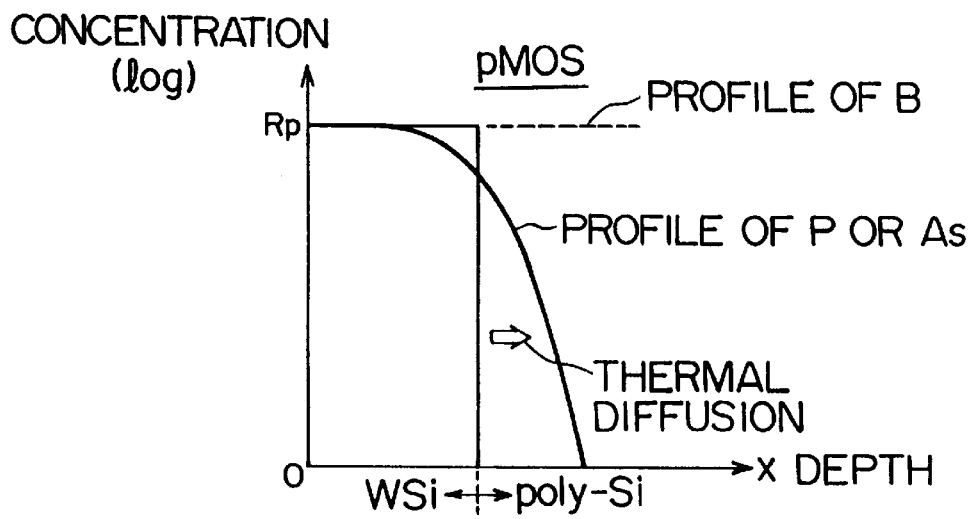

FIG. 2B and FIG. 2C are profiles of the concentration of impurities from the surface of the gate electrode 14 of the CMOS semiconductor device 2 illustrated in FIG. 2A in the direction of depth. FIG. 2B shows the nMOS side and FIG. 2C shows the PMOS side.

As shown in FIG. 2B, at the nMOS side, a uniform profile of concentration (shown by solid line in figure) of the n-type impurity (P, As, etc.) is formed from the upper silicide electrode layer 18 to the lower gate electrode layer 16 with the doped impurity concentration Rn of the lower layer. Similarly, at the pMOS side of FIG. 2C as well, a uniform profile of concentration (shown by solid line in figure) of the p-type impurity (B etc.) is formed with the doped impurity concentration Rp of the lower layer.

Accordingly, even when performing annealing to activate the source and drain regions or performing other thermal annealing, the silicide electrode layer 18 will not drain the impurities from the lower gate electrode layer 16 as in the past. As a result, so-called mutual diffusion of the doped impurities of the gate electrodes is prevented. Note that the silicide electrode layer 18 is also uniformly doped with impurities of a conductivity opposite to the doped impurities and, as illustrated, heat treatment causes heat diffusion in the gate electrode layer 16 toward the gate oxide film 12. However, since the doped impurities of the gate electrode layer 16 are maintained at the predetermined concentrations Rn and Rp, the above-mentioned undesirable diffusion does not progress much. For this reason, it is not believed that diffusion of impurities of opposite conductivities will be a problem.

Second Embodiment

The second embodiment shows the case of application of the present invention to a SALICIDE (self-aligned silicide) process.

Figure 3:
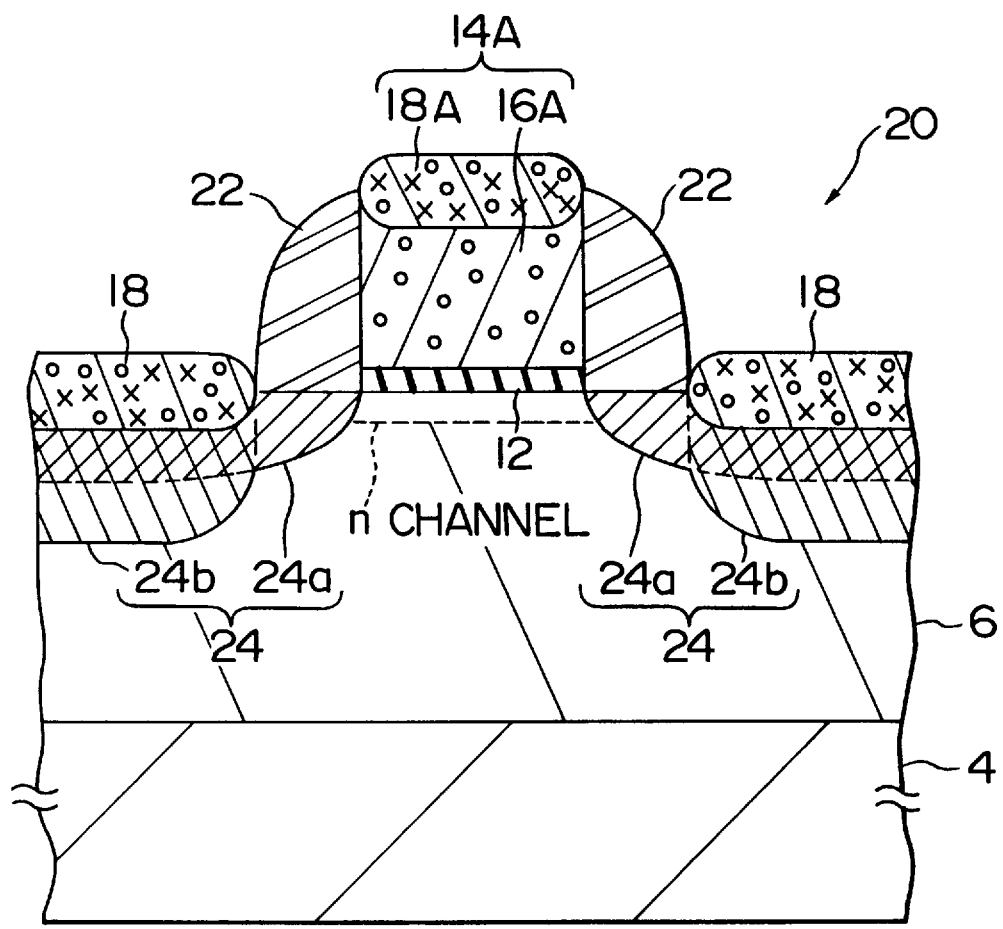
FIG. 3 is a schematic sectional view of the construction of a CMOS semiconductor device according to a second embodiment of the present invention seen from a direction perpendicular to the direction of gate interconnections.

FIG. 3 is a schematic sectional view of the construction of a CMOS semiconductor device according to the second embodiment of the present invention showing the area around the nMOS transistor from a direction perpendicular to the direction of gate interconnections.

This figure and the following explanation make reference to an nMOS transistor, but the same apply to the pMOS side as well. Further, parts of the configuration similar to those of the first embodiment illustrated in FIG. 1 are given the same reference numerals and are not explained further.

This CMOS semiconductor device 20 is comprised of a semiconductor substrate 4 on which is formed a p-well on the surface of which is in turn formed, through a gate oxide film 12, a dual-layer construction gate electrode 14A comprised of a gate electrode layer 16A similar to the gate electrode layer 16 illustrated in FIG. 1 (but with a different shape) and a suicide electrode layer 18A similar to the upper silicide electrode layer 18 shown in FIG. 1 (but with a different shape). At the side of the dual-layer construction gate electrode 14 is for example formed a side wall 22 comprised of a plasma $SiO_2$ film using tetraethylorthosilicate (TEOS) as a source. At the surface of the semiconductor substrate 4 below this side wall 22 is formed a source or drain region 24. This source or drain region 24, as illustrated for example, is comprised of a relatively low concentration shallow layer 24a (for example, an LDD (lightly doped drain) layer) extending to the outside from near the edge of the dual-layer construction gate electrode 14A and a relatively high concentration shallow layer 24b extending to the outside from near the outside edge of the side wall 22.

The side wall 22 and the source or drain region 24 are formed by the usual methods. As a specific example, after the dual-layer gate electrode 14A is formed, an LDD or other shallow layer 24a is formed by for example injecting arsenic ions ($As^+$) at an energy of 20 KeV and a dosage of $1 \times 10^{14}/cm^2$. Note that the corresponding conditions for the pMOS side would for example be injecting borofluoride ions ($BF_2^+$) at an energy of 20 KeV and a dosage of $1 \times 10^{14}/cm^2$. Next, a 200 nm silicon oxide film is formed and the entire surface is etched back to form the side wall 22. The shallow layer 24b is then formed by injecting ions at a high concentration.

The gate electrode layer 16A is made conductive at the same time to simplify the process. The ion implantation is performed by for example injecting arsenic ions ($As^+$) at an energy of 20 KeV and a dosage of $1 \times 10^{15}/cm^2$. Note that the corresponding conditions for the pMOS side would be injecting borofluoride ions ($BF_2^+$) at an energy of 20 KeV and a dosage of $1 \times 10^{15}/cm^2$.

In the CMOS semiconductor device 20 of the second embodiment, a suicide electrode layer 18A including two types of impurities with mutually different conductivities is formed similarly as with the gate electrode layer 16A on the surface of the substrate 4 at the outside of the side wall 22.

The silicide electrode layer 18A may be formed by the so-called "pinning" method for self-alignment with the gate electrode layer 16A and the source or drain region 24. That is, first, a layer of titanium, cobalt, or nickel doped with the impurities is formed to a predetermined thickness (for example 30 nm) by the CVD method or the sputtering method. The method of implantation of the impurities at this time is similar to that of the first embodiment. That is, CVD is performed while adjusting the flow rate of the impurity gas or use is made of a sputtering target containing a predetermined concentration of the impurities.

Next, the metal film is silicified by heat treatment and is selectively removed. The conditions differ depending on the type of the metal film. Here, as an example, the case of forming a titanium silicide ($TiSi_2$) film as a metal silicide layer 18A from a titanium film is illustrated. First, the titanium film is annealed to silicify it. This initial annealing is performed for example by rapid thermal annealing (RTA) by a lamp at 600° C. for 1 minute. This causes silicification of just the exposed portion of the substrate 4K and the gate electrode layer 16A portion. Next, the side wall 22 and other non-silicified portions on the insulating film are selectively removed by acid (for example, an aqueous solution of ammonia and hydrogen peroxide ($NH_3+H_2O_2+H_2O$), an aqueous solution of sulfuric acid and hydrogen peroxide ($H_2SO_4+H_2O_2+H_2O$), etc.) Next, second annealing is performed to lower the resistance of the silicified layer. This second annealing is performed by for example RTA by lamp heating at 800° C. for 1 minute.

The subsequent processing of the gate electrode 14, formation of the source and drain regions, formation of the interlayer insulating layer and the contact holes, formation of the metal interconnection layer, etc. are performed by the usual methods in the same manner as in the first embodiment.

In a SALICIDE process using the present invention, since the impurities are already doped into the silicide electrode layer 18A formed in the initial annealing, the impurities will not be drained from the lower source or drain region 24 at the time of the second high temperature annealing as in the past and therefore the contact resistance will not deteriorate. Due to this, even when the source or drain region 24 is extremely shallow, the contact resistance will not deteriorate and the resistance of the gate, source, and drain can be lowered by self-alignment, so application of the SALICIDE process to submicron devices becomes easy.

Note that the method of selective formation of the silicide electrode layer 18A is not limited to the one explained above. It is also possible to use a selective CVD method using the side wall 22 as the separating film.

According to the CMOS semiconductor device according to the present invention and the method of production of the same, it is possible to prevent the doped impurities in the gate electrode layer, implanted separately at the nMOS side and pMOS side, from diffusing to the upper silicide electrode layer side at the time of subsequent heat treatment. Due to this, the problem of mutual diffusion in so-called dual-gate construction gate electrodes can be solved.

In particular, if the silicide electrode layer is formed while doping the impurities by the CVD method or sputtering method, there is no need to provide a separate step for doping the impurities.

Further, it is possible to simultaneously prevent the deterioration of the contact resistance of the source or drain regions when applying this to a SALICIDE process.

As explained above, it is therefore possible to provide a CMOS semiconductor device using a dual-gate electrode construction suited for formation of finer electrodes and a method for the production of the same.

What is claimed is:

1. A method of forming a CMOS semiconductor device having a dual-gate construction, comprising the steps of at the time of forming dual-layer construction gate electrodes comprised of a lower gate electrode layer with p-type or n-type impurities doped separately for the different channel conductivity type transistor regions of the p-channel and n-channel MOS transistors and an upper common silicide electrode layer, forming a polycrystalline silicon film for forming the lower gate electrode layer, selectively doping said polycrystalline silicon film with p-type or n-type impurities for said different channel conductivity type transistor regions, and forming a silicide film to form the upper common silicide electrode layer on the polycrystalline silicon film, the silicide film being doped with both the same degree of p-type impurities as the concentration of the p-type impurities of the lower gate electrode layer and the same degree of n-type impurities as the concentration of n-type impurities of the gate electrode layer while being formed.

2. A method of forming a CMOS semiconductor device having a dual-gate electrode construction as set forth in claim 1, wherein the dual-gate electrode construction comprised of the lower gate electrode layer with p-type or n-type impurities doped separately for the different channel conductivity type transistor regions and the upper common silicide electrode layer is formed by self-alignment.

3. A method of forming a CMOS semiconductor device having a dual-gate electrode construction as set forth in claim 1, wherein the upper common silicide electrode layer is formed by the CVD method or the sputtering method.

4. A method of forming a CMOS semiconductor device having a dual-gate electrode construction as set forth in claim 1, wherein the upper common silicide electrode layer is comprised of a material selected from the group comprised of tungsten silicide, titanium silicide, cobalt silicide, and nickel silicide.

* * * * *